(12) United States Patent
Pendse

(10) Patent No.: US 7,033,859 B2
(45) Date of Patent: Apr. 25, 2006

(54) FLIP CHIP INTERCONNECTION STRUCTURE

(75) Inventor: Rajendra D. Pendse, Fremont, CA (US)

(73) Assignee: ChipPAC, Inc., Fremont, CA (US)

( * ) Notice: Subject to any disclaimer, the term of this patent is extended or adjusted under 35 U.S.C. 154(b) by 0 days.

(21) Appl. No.: 10/850,093

(22) Filed: May 20, 2004

(65) Prior Publication Data

US 2004/0212098 A1  Oct. 28, 2004

Related U.S. Application Data

(63) Continuation of application No. 09/802,664, filed on Mar. 9, 2001, now Pat. No. 6,815,252.

(60) Provisional application No. 60/188,570, filed on Mar. 10, 2000.

(51) Int. Cl.
   *H01L 21/44* (2006.01)
   *H01L 21/30* (2006.01)

(52) U.S. Cl. .............. 438/107; 438/108; 438/118; 438/455

(58) Field of Classification Search ........ 438/107, 438/108, 118, 455, 612, 613; 257/778–780
   See application file for complete search history.

(56) References Cited

U.S. PATENT DOCUMENTS

| | | | |
|---|---|---|---|
| 3,665,590 A | 5/1972 | I'ercival | |
| 4,208,005 A | 6/1980 | Nate et al. | |
| 5,210,938 A | 5/1993 | Hirai | |
| 5,250,469 A | 10/1993 | Tanaka et al. | |
| 5,346,857 A | 9/1994 | Scharr et al. | |
| 5,386,624 A | 2/1995 | George et al. | |
| 5,508,561 A | 4/1996 | Tago et al. | |
| 5,592,736 A | 1/1997 | Akram et al. | |
| 5,686,317 A | 11/1997 | Akram et al. | |
| 5,714,252 A * | 2/1998 | Hogerton et al. | 428/344 |
| 5,717,477 A | 2/1998 | Fritz et al. | |
| 5,801,350 A | 9/1998 | Shibuya et al. | |
| 5,829,126 A | 11/1998 | Nagao et al. | |
| 5,865,365 A | 2/1999 | Nishikawa et al. | |
| 5,869,904 A | 2/1999 | Shoji | |
| 5,874,780 A | 2/1999 | Murakami | |
| 5,892,289 A | 4/1999 | Tokuno | |
| 5,931,371 A | 8/1999 | Pao et al. | |
| 5,953,814 A | 9/1999 | Sozansky et al. | |
| 6,037,192 A | 3/2000 | Witzman et al. | |
| 6,100,597 A | 8/2000 | Nakamura | |
| 6,130,476 A | 10/2000 | LaFontaine, Jr. et al. | |
| 6,153,940 A | 11/2000 | Zakel et al. | |
| 6,173,887 B1 | 1/2001 | Mead et al. | |
| 6,194,781 B1 * | 2/2001 | Ikegami | 257/737 |
| 6,214,642 B1 | 4/2001 | Chen et al. | |
| 6,225,144 B1 | 5/2001 | How et al. | |
| 6,326,234 B1 | 12/2001 | Nakamura | |
| 6,335,568 B1 * | 1/2002 | Yuzawa et al. | 257/738 |
| 6,337,522 B1 | 1/2002 | Kang et al. | |

\* cited by examiner

*Primary Examiner*—Hsien-Ming Lee
(74) *Attorney, Agent, or Firm*—Bill Kennedy; Haynes Beffel & Wolfeld LLP

(57) ABSTRACT

A flip chip interconnection structure is formed by mechanically interlocking joining surfaces of a first and second element. The first element, which may be a bump on an integrated circuit chip, includes a soft, deformable material with a low yield strength and high elongation to failure. The surface of the second element, which may for example be a substrate pad, is provided with asperities into which the first element deforms plastically under pressure to form the mechanical interlock.

23 Claims, 3 Drawing Sheets

FLIP CHIP INTERCONNECTION STRUCTURE

CROSS REFERENCE TO RELATED APPLICATIONS

This application is a Continuation of U.S. application Ser. No. 09/802,664, filed Mar. 9, 2001, now U.S. Pat. No. 6,815,252, which claims priority from U.S. Provisional Application No. 60/188,570, filed on Mar. 10, 2000 titled "Flip Chip Interconnection Structure". This application is related to commonly assigned U.S. application Ser. No. 09/802,375 titled "Packaging Structure and Method" filed Mar. 9, 2001 and U.S. application Ser. No. 09/802,443 titled "Flip Chip-in-Leadframe Package and Process" filed Mar. 9, 2001, now U.S. Pat. No. 6,828,220; both said related applications are hereby incorporated by reference in their entireties herein.

BACKGROUND OF THE INVENTION

This invention relates to flip chip interconnection structures and, more particularly, to an interconnect structure formed by mechanical deformation and interlocking of asperities between the surfaces to be joined.

Flip chip interconnection between an integrated circuit (IC) chip and a substrate is commonly performed in electronic package assembly. In the most common form of such interconnection bumps on the IC chip are metallurgically joined to pads formed on the substrate, usually by melting of the bump material. While this approach provides robust connections, it is difficult to reduce the pitch of the interconnection due to the risk of bridging (i.e. shorting between adjacent connections) during the melting and solidification processes. In an alternative approach the attachment is made using a particulate film or paste, whereby conductive particles in the paste or film together with the shrinkage force of a resin effect an electrical connection. This approach lends itself to reduction of interconnection pitch but suffers from limited long term reliability owing to the susceptibility of the particulate interconnection to degrade over time.

BRIEF SUMMARY OF THE INVENTION

In one general aspect the invention features a method for forming a flip chip interconnection structure, by providing a first member on an IC chip and a second member on a substrate, in which the first member includes a deformable material having a low yield strength and a high elongation to failure and the second member has surface asperities on the part to be bonded with the first member; and pressing the first and second members against one another using a force sufficient to cause plastic flow of part of the first member into asperities on the second member.

In some embodiments the first member is a bump formed on the IC chip, and typically is one of a set of such bumps; and the deformable materials of the first member in some particularly useful embodiments includes gold. In some embodiments the second member is a lead or pad on the substrate, or is a via opening. In some embodiments the second member is a surface pad having a conventional plated surface finish, on which the asperities are provided according to the invention.

In another general aspect the invention features a flip chip interconnection structure made-by the method of the invention.

In another general aspect the invention features a flip chip interconnection structure, which includes a first member attached to a chip and a second member attached to a substrate, in which the first member is of a deformable material and the first and second members are bonded by mechanical interlocking of the deformable material of the first member with asperities on the surface of the second member.

DETAILED DESCRIPTION OF THE INVENTION

Figure 1A:
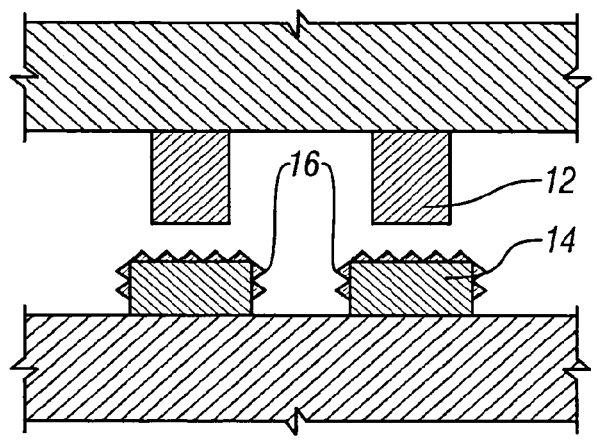
FIGS. 1A, 1B are diagrammatic sketches in a sectional view showing an illustrative embodiment according to the invention of steps in the formation of an assembly having a chip interconnection structure according to the invention.
Figure 1B:
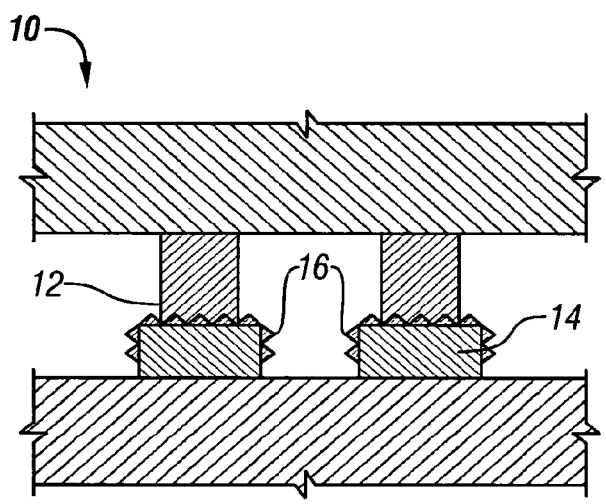

With reference to FIGS. 1A, 1B a flip chip interconnection structure generally designated 10 is shown schematically including a first member 12 and a second member 14. The first member 12 is preferably a bump formed on the IC chip and the second member 14 is preferably a lead or pad formed on the substrate. The first member 12 further preferably comprises a soft, deformable material with a low yield strength and high elongation to failure. The second member 14 further preferably includes a substrate pad with a conventional plated surface finish, and is characterized by having asperities 16, which are shown exaggerated in the Figs. for purposes of illustration. The scale of the asperities is generally in the order about 1 µm–25 µm. The bump is a generally compliant material, that is to say, a material that, in the particular bump as shaped, undergoes a plastic deformation greater than about 25 µm under a force equivalent to a vertical load of about 250 grams. Gold can be a particularly useful material for the bumps according to the invention.

The interconnection is accomplished by compressing the first member 12 and the second member 14 against one another to cause plastic flow of first member 12 into asperities 16. The height and soft nature of first member 12 allows considerable deformation to occur even after the connection is effected thus allowing for other bump/pad pairs with poor planarity to be joined with equal success. The force and temperature requirements necessary to effect the interconnection are significantly lower than needed for conventional thermo-compression bonds that require metallurgical diffusion of the mating materials. These reduced requirements greatly reduce damage that might otherwise occur on the chip, particularly when the number of connections to be effected simultaneously is large.

Figure 2A:
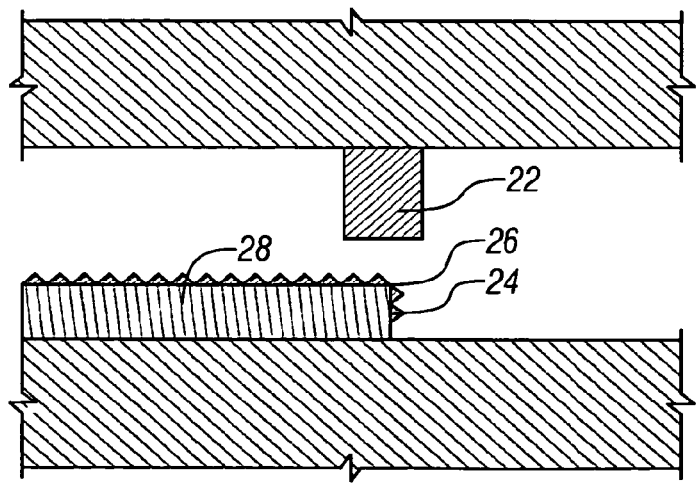
FIGS. 2A, 2B are diagrammatic sketches in a sectional view showing a second illustrative embodiment according to the invention of steps in the formation of an assembly having a chip interconnection structure according to the invention.
Figure 2B:
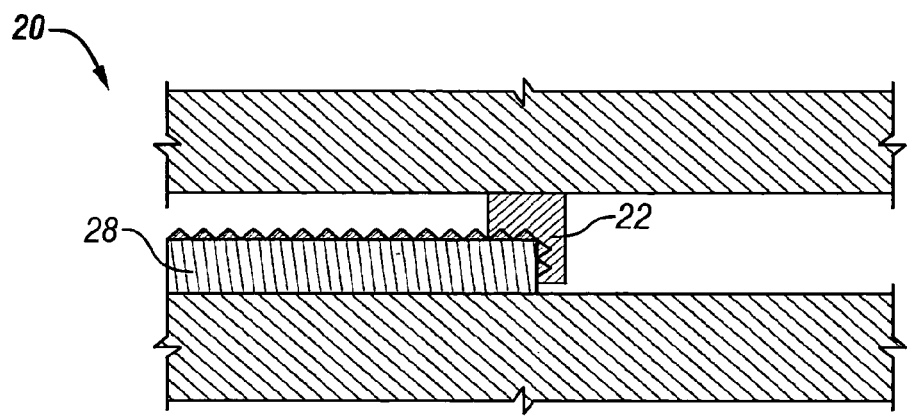

A second embodiment is schematically shown in FIGS. 2A, 2B. A macroscopic interlocking configuration generally designated 20 is formed by plastic flow of the material of first member 22 around a side wall 24 and edge 26 of a second member or trace 28. Preferably the flow of the material of first member 22 is around the side wall 24 and does not cause material flow into a region between adjacent traces but rather in the normal direction within the same plane. The interlocking configuration 20 provides for an increased area of interlocked surfaces without significantly increasing the bonding force, thereby providing a more robust connection. Further the additional displacement perpendicular to the chip surface provides greater tolerance to poor co-planarity of multiple mating surface. Finally, the interlocking along a plane perpendicular to the chip surface in addition to the usual interlocking parallel to the chip surface provides for protection against relative movement between the die and the substrate in a perpendicular direction.

Figure 3A:
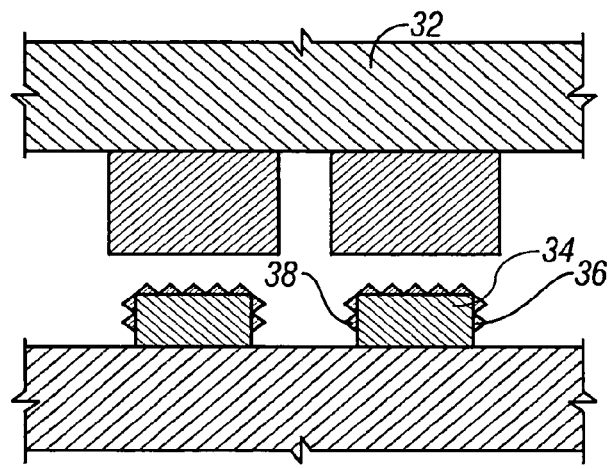
FIGS. 3A, 3B are diagrammatic sketches in a sectional view showing a third illustrative embodiment according to the invention of steps in the formation of an assembly having a chip interconnection structure according to the invention.
Figure 3B:
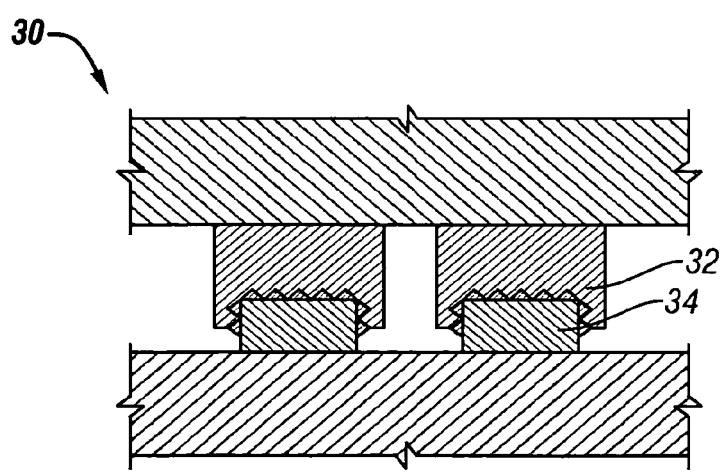

A third embodiment is shown in FIGS. 3A, 3B and includes an interconnection generally designated 30. The interconnection 30 is formed by plastic flow of the material of a first member 32 around a second member 34. The second member 34 includes a smaller width than that of the first member 32 which allows for plastic flow of the material of first member 32 around both sides 36 and 38 of the second member 34.

Figure 4A:
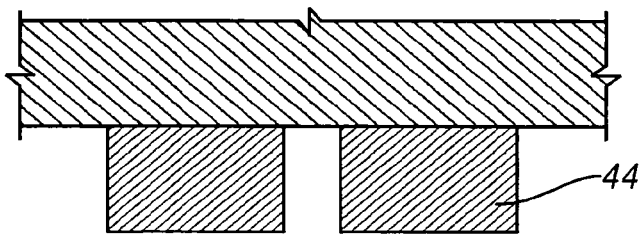
FIGS. 4A, 4B are diagrammatic sketches in a sectional view showing a fourth illustrative embodiment according to the invention steps in the formation of an assembly having a chip interconnection structure according to the invention.
Figure 4B:
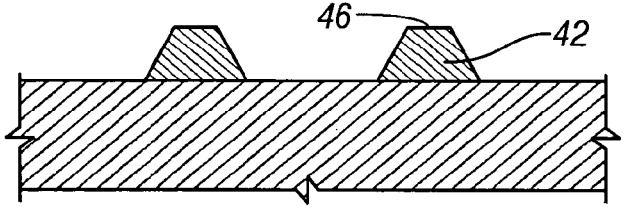

A fourth embodiment is shown in FIGS. 4A, 4B and includes an interconnection generally designated 40. The lead geometry of a second element 42 is shown to be wedge shaped to take advantage of what represents the most typical "undercut" lead shape in actual substrates that are fabricated by the subtractive etching method. The interconnection 40 is formed by plastic flow of the material of a first element 44 around the second element 42. The shown geometry removes the restriction of minimum trace width and more specifically the minimum width of a plateau 46 necessary for conventional wire bonding applications. It is contemplated that the interconnection 40 could alternatively be formed by bonding directly on a via pad or through a via hole down to the next lower layer on the substrate.

In embodiments as described above with reference to FIGS. 2A, 2B, 3A, 3B, 4A, 4B, the macroscopic interlocking configuration allows for formation of the interconnect using a lower force, for example lower by a factor of 2, as compared with embodiments as described above with reference to FIGS. 1A, 1B. Use of lower force of compression can result in less damage to chips during processing.

In preferred embodiments, an adhesive resin is preferably applied in a space between the chip and the substrate such that the compressive force supplied by the cured resin further improves the long-term retention of the electrical connection. The adhesive resin is preferably applied before the mating surfaces are bonded, and is cured concomitantly with the formation of the interconnection. The applied interconnection force helps displace the resin material away from the mating surfaces to allow the formation of the desired mechanically interlocked connection. Alternatively, the resin can be applied after the interconnection using an underfill process.

In the disclosed preferred embodiments, the material of the first members 12, 22, 32 and 44 is preferably Cu, electroless NiAu or Au. The substrate material is preferably single-sided FR5 laminate or 2-sided BT-resin laminate.

Figure 5:
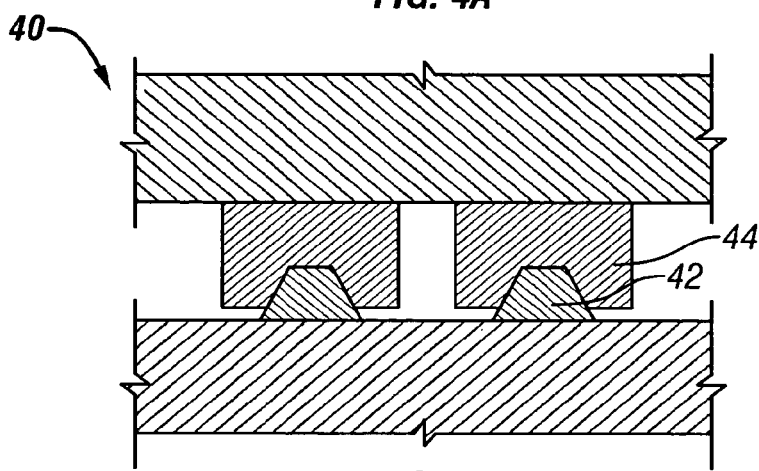
FIG. 5 is a diagrammatic sketch in a sectional view showing an alternative shape for an interconnection bump useful according to the invention.
Figure 5:
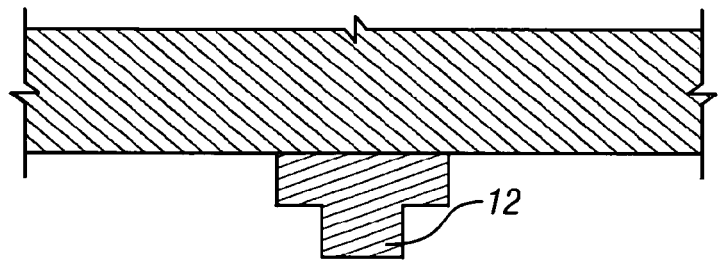
Figure 6:
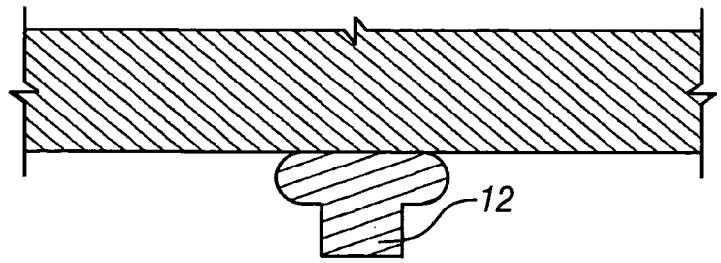
FIG. 6 is a diagrammatic sketch in a sectional view showing another alternative shape for an interconnection bump useful according to the invention.

The bumps may have various configurations other than one shown in the Figs. above having a generally rectangular section before compression and deformation; two particularly useful ones are shown diagrammatically in FIGS. 5 and 6. FIG. 5 shows a "stepped" shape, in which the portion of the bump adjacent the chip (the "base") is wider than the portion (the "tip") that will be compressed against the pad on the substrate. FIG. 6 shows a "stud bump" configuration, in which the base has a peripherally rounded profile that is wider than the tip. Either of these constructs can provide improved compliance of the bump with the asperities on the substrate, owing to the thinner tip dimension, and also provide good structural stability owing to the wider profile of the base.

The second member may be a lead or a pad, as described above, and a bump may be interconnected to a conventional solder pad that is electrically connect to a via hole; but in some embodiments the second member itself includes a via hole. According to this embodiment of the invention an interconnection structure can be formed directly between the bump and the via hole, by compressing the bump directly against conductive material in and at the margin of the via hole, rather than compressing the bump onto a pad, such as a solder pad, formed at some distance away from the via hole and connected to it. This results in a more efficient use of the area on the chip. Where the opening in the via hole is generally smaller than the tip of the bump, then the bump can be pressed directly onto the via hole, and becomes deformed into the via hole to form the interconnection; in effect, the via hole works as the asperity in this construct, where the bump is smaller than the via hole, then the bump can be offset, so that the bond is formed at a portion of the rim of the via opening.

What is claimed is:

1. A method for forming a flip chip interconnection structure, comprising
   providing a first member on an IC chip and a second member on a substrate, the first member comprising a deformable material having a low yield strength and a high elongation to failure and the second member as provided having surface asperities on a surface on a part of the second member to be bonded with the first member; and
   bringing the first member into contact with the surface on the second member and pressing the first and second members against one another using a force sufficient to cause plastic flow of part of the first member into the surface asperities on the second member, whereby part of the first member undergoes plastic deformation into the asperities on the second member.

2. The method of claim 1 wherein the first member is a bump formed on the IC chip.

3. The method of claim 2, said bump comprising one of a set of such bumps.

4. The method of claim 1 wherein the deformable material of the first member comprises gold.

5. The method of claim 1 wherein the second member is a surface pad.

6. The method of claim 1 wherein the second member is a lead.

7. The method of claim 1 wherein the second member is a via opening.

8. The method of claim 1 wherein the second member has a plated finish.

9. The method of claim 1 wherein the part of the second member to be bonded with the first member has a generally trapezoidal shape in transverse sectional view, the second surface comprising a plateau having a width smaller than a width of the first member.

10. The method of claim 1, further comprising, prior to pressing the first and second members against one another, dispensing a curable adhesive onto a mating surface of the substrate.

11. The method of claim 1, further comprising, prior to pressing the first and second members against one another, dispensing a curable adhesive onto a mating surface of the IC chip.

12. A method for forming a flip chip interconnection structure, comprising
providing a first member on an IC chip and a second member on a substrate, the first member comprising a deformable material having a low yield strength and a high elongation to failure and the second member as provided having a surface adjacent an edge on a part of the second member to be bonded with the first member; and
bringing the first member into contact with the second member surface and pressing the first and second members against one another using a force sufficient to cause plastic flow of part of the first member around the edge, whereby part of the first member undergoes plastic. deformation round the edge.

13. The method of claim 12 wherein the first member is a bump formed on the IC chip.

14. The method of claim 13, said bump comprising one of a set of such bumps.

15. The method of claim 12 wherein the deformable material of the first member comprises gold.

16. The method of claim 12 wherein the second member is a surface pad.

17. The method of claim 12 wherein the second member is a lead.

18. The method of claim 12 wherein the second member is a via opening, a margin of the via opening comprising the edge.

19. The method of claim 12 wherein the second member has a plated finish.

20. The method of claim 12 wherein the part or the second member to be bonded with the first member has a generally trapezoidal shape in transverse sectional view, the second member surface comprising a plateau having a width smaller than a width of the first member.

21. The method of claim 12, further comprising, prior to pressing the first and second members against one another, dispensing a curable adhesive onto a mating surface of the substrate.

22. The method of claim 12, further comprising, prior to pressing the first and second members against one another, dispensing a curable adhesive onto a mating surface of the IC chip.

23. The method of claim 12, the second member being provided with asperities on a surface thereof.

* * * * *